United States Patent [19]

Haitz

[11] 3,820,236

[45] June 28, 1974

[54] METHOD OF MAKING METAL SEMICONDUCTOR DIODES HAVING PLATED HEAT SINK MEMBERS

[75] Inventor: Roland H. Haitz, Richardson, Tex.

[73] Assignee: Texas Instruments Incorporated, Dallas, Tex.

[22] Filed: Mar. 31, 1972

[21] Appl. No.: 239,989

Related U.S. Application Data

[62] Division of Ser. No. 835,180, June 20, 1969.

[52] U.S. Cl. .......................... 29/583, 29/580, 29/591

[51] Int. Cl. .......................... B01j 17/00

[58] Field of Search ............. 29/580, 583, 589, 591; 317/235 AB, 235 AJ

[56] References Cited

UNITED STATES PATENTS

| | | | |
|---|---|---|---|
| 2,819,513 | 1/1958 | Martin | 29/583 |
| 3,457,471 | 7/1969 | Moroney et al. | 317/234 |
| 3,523,223 | 8/1970 | Luxem et al. | 317/234 |

*Primary Examiner*—W. Tupman
*Attorney, Agent, or Firm*—Harold Levine; Edward J. Connors, Jr.; William E. Hiller

[57] ABSTRACT

A significant improvement in the heat flow resistance of microwave diodes may be achieved by plating a heat sink to the metal layer of a Schottky barrier structure. A semiconductor substrate has an epitaxial layer grown thereon in accordance with standard epitaxial procedures. The Schottky barrier is then fabricated by properly preparing the surface of the epitaxial layer and then evaporatively depositing a layer of metal at a temperature such that the metal nucleates to form a very thin film to produce a rectifying contact with the epitaxial layer. A heat sink material is then plated onto the metal film of the rectifying contact to a thickness sufficient to insure heat conduction away from the Schottky barrier. Typically, the heat sink may be plated copper.

5 Claims, 6 Drawing Figures

METHOD OF MAKING METAL SEMICONDUCTOR DIODES HAVING PLATED HEAT SINK MEMBERS

Figure 1:
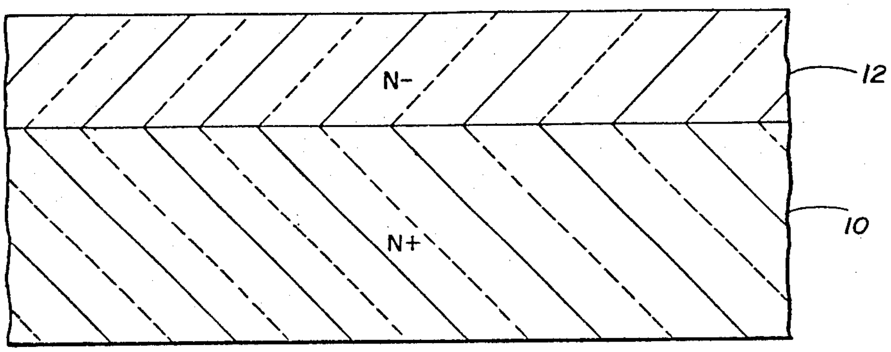
Figure 2:
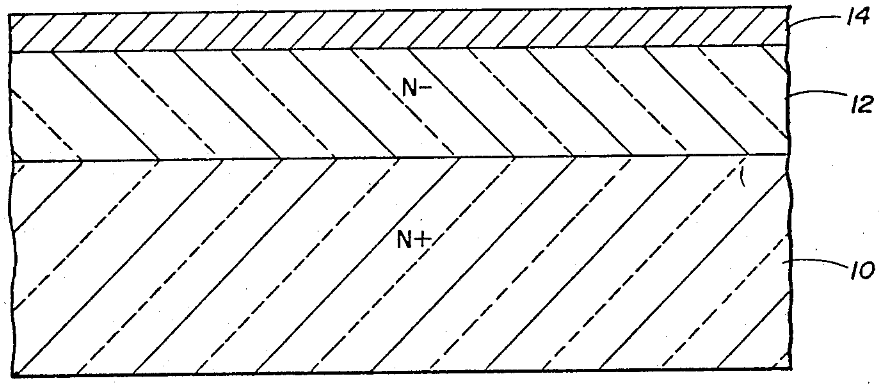
Figure 3:
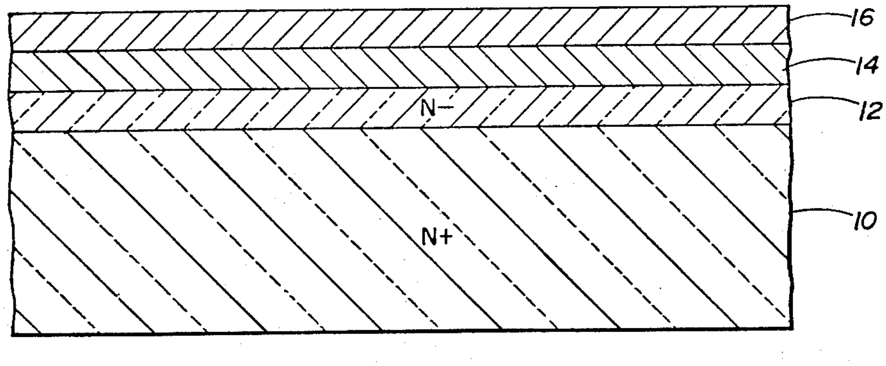
Figure 4:
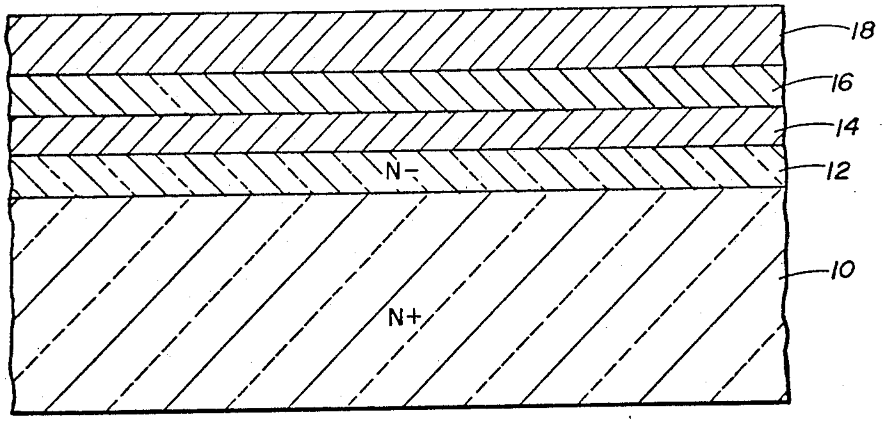
Figure 5:
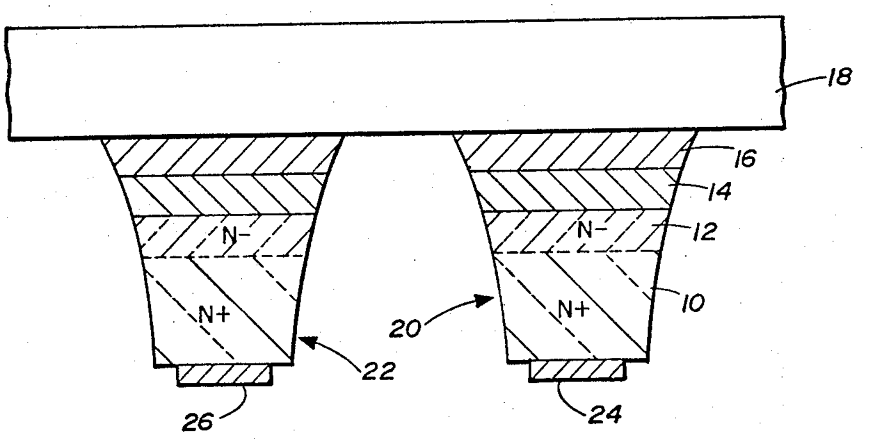

This is a division of the application Ser. No. 835,180, filed June 20, 1969.

This invention relates to a flip-chip Schottky avalanche diode, and, more particularly, to a metal-semiconductor diode having a heat sink plated onto the metal film.

In the fabrication of semiconductor diodes for applications requiring high power levels per unit area, considerable difficulty has been expreienced in mounting the semiconductor chip onto a suitable heat sink. Typically, the semiconductor chip is on the order of from 3 to 8 mils in diameter and is difficult to handle. Even where successful techniques have been developed for mounting these small chips to a suitable heat sink, the heat flow resistance has been somewhat less than satisfactory. This is primarily the result of a poor interface between the semiconductor chip and the heat sink.

With conventional thermal-compression or ultrasonic mounting techniques, the chances of flip-chip mounting a Schottky barrier and still maintain breakdown uniformity are extremely small. Primarily, this is because of problems at the edge when a soft metal (such as silver) is used in the bonding technique. In previous mounting techniques, the soft metal often has come in contact with the semiconductor surface, thereby destroying the Schottky barrier or adversely affecting its operating characteristics.

An object of the present invention is to provide a metal-semiconductor diode having improved heat flow resistance when mounted to a heat sink. Another object of this invention is to provide a process for fabricating a metal-semiconductor diode with a heat sink. A further object of this invention is to provide a metal-semiconductor diode with a heat sink plated to the metal layer of the rectifying junction. Still another object of this invention is to provide a process for fabricating a heat sink to a metal-semiconductor diode having lower parasitic resistance.

In accordance with the present invention, a single crystal of semiconductor material is epitaxially grown onto a substrate having a relatively high impurity concentration. the epitaxially grown crystal has a low impurity concentration as compared to the impurity concentration of the semiconductor substrate. A metal film is formed onto the epitaxial layer which has the necessary barrier height relationship to the semiconductor substrate to produce a rectifying contact therewith. To provide improved heat flow resistance, a heat sink is plated onto the metal film forming the rectifying contact. The plating of the heat sink provides a good interface between the diode metal film and the heat sink.

In accordance with a specific embodiment of this invention, a crystal of $n^-$ -type silicon is epitaxially grown onto a substrate of $n^+$ -type silicon. A metal film, such as titanium, tungsten, molybdenum or tantalum, is evaporatively deposited onto the epitaxially grown crystal to form a rectifying junction therewith. Copper is then plated to the metal film to a desired thickness to insure adequate heat flow from the rectifying contact.

A more complete understanding of the invention and its advantages will be apparent from the specification and claims and from the accompanying drawings illustrative of the invention.

Figure 6:
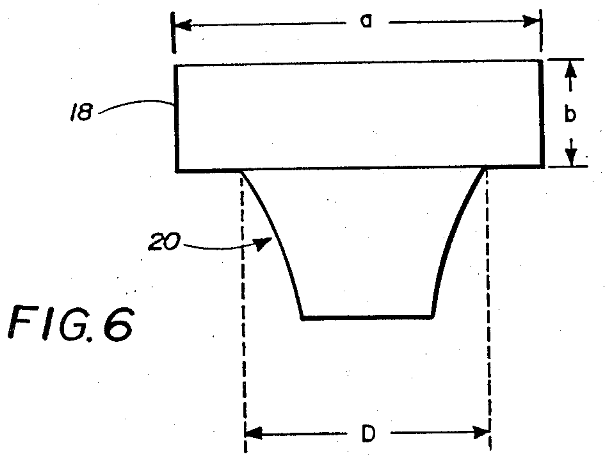

Referring to the drawings:

FIGS. 1–5 are cross sections of a metal-semiconductor structure illustrating the steps in the fabrication of flip-chip Schottky barrier diodes; and FIG. 6 is a cross section of a single diode illustrating a typical relationship of the dimensions thereof.

Referring to the drawings, a starting material for fabricating a plurality of Schottky barrier diodes in accordance with the present invention may be a low-resistivity, high-impurity silicon. This substrate 10 may be typically 100 to 150 microns thick to provide the necessary bulk for ease of handling during the fabrication processing. Other materials than silicon may be used for the substrate 10.

The first step in producing metal-semiconductor diodes is to epitaxially grow a single crystal layer 12 onto th substrate 10. Any of the well-known epitaxial processes may be used. In accordance with a standard gas phase technique, the ratio of silicon atoms (assuming a silicon substrate) to impurity atoms in the gas phase is controlled so that the layer 12 contains the desired impurity content. By changing the type of impurity or the impurity concentration in the gas phase, the desired high resistivity and low impurity concentration can be changed almost without limit, and this can be accomplished without resorting to compensation procedures.

Starting with a relatively thick substrate 10 of $n^+$ -type low-resistivity silicon material, it is possible to grow epitaxially a thin layer 12 (on the order of 5 microns for a device operating at 10GHz) of $n^-$ -type high-resistivity silicon material on top of the substrate. The substrate 10, because of its extremely low resistivity, is essentially a conductor and does not degrade the electrical characteristic of the device.

After epitaxially growing the single crystal layer 12, a metal film rectifying layer 14 is formed on top of the layer 12. Any metal having the necessary barrier height relationship to the chosen semiconductor material of the substrate 10 may be used. A group of preferred materials includes titanium, tungsten, molybdenum and tantalum. After polishing the single crystal layer 12, the metal film may be deposited, using conventional evaporation equipment. In accordance with standard evaporation techniques, the semiconductor surface is heated to a temperature in the range of from about 250° C to about 350° C, or as high as possible without a deleterious effect. Then, metal atoms are directed at the surface of the heated semiconductor in a vacuum for a period sufficient to produce a layer of metal having the desired thickness. Preferably, the metal atoms are derived by evaporation, but sputtering, or other suitable techniques may also be employed. Care should be exercised in forming the metal film 14 so as to minimize the rate of diffusion of the metal into the single crystal layer 12, thus degrading the quality of the Schottky barrier rectifying contact being formed. Since the deposition of the Schottky barrier does not require high temperatures, any out-diffusion from the $n^+$ substrate into the $n^-$ layer 12 will be minimized. This preserves the steep gradient at the $n^-$–$n^+$ interface which reduces parasitic resistance and improves operating efficiency and noise.

Next, a thin metal bonding layer 16 is formed on top of the rectifying layer 14 to improve adhesion of a heat sink metal to the layer 14. The bonding layer 16 may also be formed by evaporatively depositing metal in a vacuum furnace or by any of the plating techniques available. The thickness of the bonding layer 16 need only be several microns thick. Depending on the metal used in the rectifying layer 14, the bonding layer 16 may not be required. for example, if gold is used to form the Schottky barrier rectifying contact, then the layer 16 would not be required. Typical metals that may be used for the bonding layer 16 include gold and silver.

The next step in preparing semiconductor diodes in accordance with the present invention is the plating of a heat sink metal 18 on top of the bonding layer 16. Either electro-plating or electroless plating may be used to form the heat sink 18. Basically, electro-plating is a process for coating objects with tightly adhering layers of metal by means of electrodes connected to an energy source placed in an aqueous solution; for example, copper sulfate. There are many conditions in an electroplating process that can be tightly controlled, and thin films of excellent adhesion and of any desired thickness can be deposited. In the electroless deposition of thin metal films, a metal ion in solution is reduced to free metal and deposited as a metallic coating without the use of electric current. If properly performed, electroless plating can yield a non-porous thin film of uniform thickness and density. Using either an electro-plating or electroless plating technique, the heat sink 18 may be formed at a temperature below which diffusion of the rectifying metal 14 into the layer 12 will take place. A further advantage with the low temperature plating techniques is that no out-diffusion will take place between the substrate 10 and the epitaxial layer 12. This maintains the steep gradient at the $n^{-}$–$n^{+}$ interface between the substrate 10 and the layer 12 which, as explained, reduces the parasitic resistance.

After plating, the layer 18 is lapped to the desired thickness. The thickness of the layer 18 will vary with the size of the diode area. Typically, the layer 18 will be from 0.5 to 2 millimeters thick. After lapping the layer 18 to the desired thickness, the substrate 10 is then lapped to a desired thickness, e.g., on the order of 50 microns.

Next, the metal contacts 24 and 26 will be formed. After the substrate 10 has been lapped, a thin metal film is evaporatively deposited onto the substrate surface. The thin metal film is then coated with a photoresist material. After exposure and fixing by standard techniques, the photo-resist material is removed to expose the evaporatively deposited metal film except for areas outlining the contacts 24 and 26. Using standard etching techniques, all the metal film is removed to define the areas for the contacts 24 and 26. After forming the contact area, the remainder of the photo-resist material is removed and a second film of photo-resist material is deposited onto the substrate and the metal contacts. Again, the photoresist material is exposed, fixed and selectively removed to define a pattern outlining the diodes 20 and 22. This exposes the substrate 10 except in the diode areas. Then, using another etching step, the semiconductor layers 10 and 12 are removed, thereby forming the diodes 20 and 22. At this time, the metal layers 14 and 16 may be removed down to the heat sink layer 18. Finally, the heat sink is sawed into chips of convenient size (on the order of 30 to 100 mils). These large chips are mounted by conventional techniques into a suitable package.

By plating the heat sink material onto the rectifying layer 14 or the bonding layer 16, a good interface is produced. This interface significantly improves the heat flow resistance from the rectifying junction to the heat sink. Another advantage of plating a heat sink onto a rectifying junction is that the extremely steep impurity gradient of a Schottky barrier between the rectifying layer 14 and the layer 12 is maintained. This steep gradient between the impurity concentration of the rectifying layer 14 and the impurity concentration of the layer 12 also reduces the parasitic resistance of the device. As explained previously, a low value of parasitic resistance improves operation of a Schottky barrier avalanche diode as an oscillator at microwave frequencies.

Referring to FIG. 6, there is shown the relative dimensions of a typical metal-semiconductor diode including the thickness of the heat sink 18 for a given size diode 20. If the diameter of the diode is given by D, then the thickness of the heat sink 18 should be about five times D. That is, the heat sink thickness *b* equals approximately 5D. To provide adequate heat sink area, the diameter *a* of the heat sink 18 is equal to approximately 10 times the dimension D. Typically, the heat sink 18 may be copper 50 mils in diameter. The dimension D of the diode 20 is determined by the power densities which, for microwave diodes, is on the order of $10^5$ watts per centimeter squared.

While only one embodiment of the invention, together with modifications thereof, has been described in detail herein and shown in the accompanying drawings, it will be evident that various further modifications are possible without departing from the scope of the invention.

What is claimed is:

1. The method of making metal-semiconductor diodes comprising:

epitaxially growing a layer of material having a low impurity concentration onto a semiconductor substrate having a high impurity concentration, forming a metal film onto the epitaxial layer from a material having the necessary barrier height relationship to the chosen semiconductor substrate to produce a rectifying contact therewith, plating the rectifying contact metal film with copper for forming a heat sink to conduct away heat from the rectifying contact metal film, and removing selected areas of the semiconductor substrate, the epitaxial layer, and the rectifying contact metal film from the plated copper heat sink to define individual metal-semiconductor diodes, and sawing the copper heat sink into individual sections each containing a metal-semiconductor diode.

2. The method of making metal-semiconductor diodes as set forth in claim 1 wherein the copper heat sink is plated to a thickness of approximately five times the diameter of a metal-semiconductor diode

3. The method of making metal-semiconductor diodes as set forth in claim 2 wherein the copper heat sink is sawed into sections having respective widths equal to about ten times the diameter of a metal-semiconductor diode.

4. The method of making metal-semiconductor diodes comprising:

epitaxially growing a layer of material having a low impurity concentration onto a semiconductor substrate having a high impurity concentration, forming a metal film onto the epitaxial layer from a material having the necessary barrier height relationship to the chosen semiconductor substrate to produce a rectifying contact therewith, plating the rectifying contact metal film to form a metal heat sink to conduct away heat from the rectifying contact metal film, and removing selected areas of the semiconductor substrate, the epitaxial layer, and the rectifying contact metal film from the plated metal heat sink to define individual metal-semiconductor diodes, and separating the metal heat sink into individual sections each containing a metal-semiconductor diode.

5. The method of making metal-semiconductor diodes as set forth in claim 4 including the step of forming an interface metal layer between the rectifying contact metal film and the plated metal heat sink prior to the plating of the rectifying contact metal film in the formation of the metal heat sink to improve adhesion of the plated metal material comprising the heat sink to the rectifying contact metal film, and thereafter removing selected areas of the interface metal layer along with the selected areas of the semiconductor substrate, the epitaxial layer, and the rectifying contact metal film from the plated metal heat sink in defining the individual metal-semiconductor diodes.

* * * * *